(12) United States Patent
Bogi et al.

(10) Patent No.: US 11,621,555 B2
(45) Date of Patent: Apr. 4, 2023

(54) CIRCUITS TO CONTROL A CLAMPING DEVICE

(71) Applicant: Arm Limited, Cambridge (GB)

(72) Inventors: Seshagiri Rao Bogi, Bangalore (IN); Gurupadayya Shidaganti, Bengaluru (IN); Fabrice Blanc, Vinay (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/406,855

(22) Filed: Aug. 19, 2021

(65) Prior Publication Data

US 2022/0393462 A1 Dec. 8, 2022

(30) Foreign Application Priority Data

Jun. 7, 2021 (IN) .............................. 202141025161

(51) Int. Cl.
*H02H 9/04* (2006.01)
*H01L 23/60* (2006.01)
*H01L 27/02* (2006.01)

(52) U.S. Cl.
CPC ............. *H02H 9/046* (2013.01); *H01L 23/60* (2013.01); *H01L 27/0266* (2013.01)

(58) Field of Classification Search
CPC ...... H02H 9/046; H01L 23/60; H01L 27/0266
USPC .............................................. 351/56; 361/56
See application file for complete search history.

(56) References Cited

U.S. PATENT DOCUMENTS

2016/0322813 A1\* 11/2016 Aipperspach ....... H01L 29/2003
2019/0214381 A1\* 7/2019 Ginawi ............... H01L 27/0266

\* cited by examiner

*Primary Examiner* — Kevin J Comber
(74) *Attorney, Agent, or Firm* — Pramudji Law Group PLLC; Ari Pramudji

(57) ABSTRACT

In a particular implementation, an apparatus to control clamping devices includes a detection circuitry, a clamping device, inverter circuitry, and first and second control circuitry. In response to a first voltage corresponding to a gate terminal of the clamping device, the first control circuitry is configured to generate a second voltage to set the first voltage below a first voltage threshold. Also, in response to the second voltage, the second control circuitry is configured to generate a third voltage to set a voltage of the detection circuitry below a second voltage threshold.

19 Claims, 8 Drawing Sheets

CIRCUITS TO CONTROL A CLAMPING DEVICE

CROSS-REFERENCE TO RELATED APPLICATION

This application claims the benefit of Indian Application No. 202141025161 filed Jun. 7, 2021 under 35 U.S.C. 119(d).

FIELD

The present disclosure is generally related to circuits to control a clamping device.

DESCRIPTION OF RELATED ART

Robustness against electrostatic discharge (ESD) is a critical reliability issue in advanced complementary metal-oxide-semiconductor (CMOS) technologies. In CMOS integrated circuits (ICs), on-chip ESD protection circuits may be used to protect core circuitry from damaging high transient voltages (such as kV range voltages) or high transient currents (such as Amperes range) caused by ESD events. To prevent circuit damage, ESD clamp circuits are typically incorporated in supply pad library cells and/or input/output (IO) rings (i.e., IO circuits) along the periphery of a semiconductor memory chip.

Conventional ESD clamp protection schemes may utilize a resistor-capacitor (RC) circuit arrangement that may initially turn-on, then delay the "turn-off" of a clamping device (e.g., a large N-channel field effect transistor (FET) (referred to as a "bigFET"). The RC circuit arrangement may be configured to sensitize the clamping device to fast ESD voltage transient signals. By turning the clamping device "on", the clamping device may "short" the voltage across supply rails (e.g., $V_{DD}$ and $V_{SS}$) during the ESD transient event, and, therefore, quench the ESD induced stress that would otherwise be seen by any circuitry exposed between the supply rails. Hence, specifically in an ESD clamping circuit, the clamping device may shunt an ESD current between two power rails and clamp the voltage across the rails to a voltage that is safe for the functional circuitry. The absence of this type of scheme can expose internal core devices in the chip to transient voltage, thus causing catastrophic damage.

Nevertheless, as a design constraint, ESD clamping device should be able to "turn-on" quickly to prevent core devices from transient ESD event exposure but should also be able to stay off during normal power ramp events. However, during normal operation when there is no fast transient voltage on a supply rail, conventional ESD clamping devices may exhibit unacceptable current leakage due to a large clamp size as well as inverter current leakage due to rapid response of the ESD clamping device itself and due to some subthreshold leakage because of weak gate switch-off control (e.g., inrush current may be induced). In current and future subthreshold systems, especially in the context of internet-of-things (IOT) devices (that may require aggressive scaling of power to the device to rely on energy harvesting or to use a single battery for several years), the core sleep power is expected to be less than 10 nW. Nevertheless, any power benefits are negated by intolerable IO leakage partly as a result of the above-described design constraint. The problem may be exacerbated by the higher IO voltage as compared to core voltage. Hence, there is a need in the art for ESD circuits that satisfy low current leakage requirements, provide ESD protection and inrush current immunity. Moreover, increasing ESD clamping efficiency can allow the reduction of the size of bigFET size, and therefore allow the proportional reduction of leakage.

Figure 1:
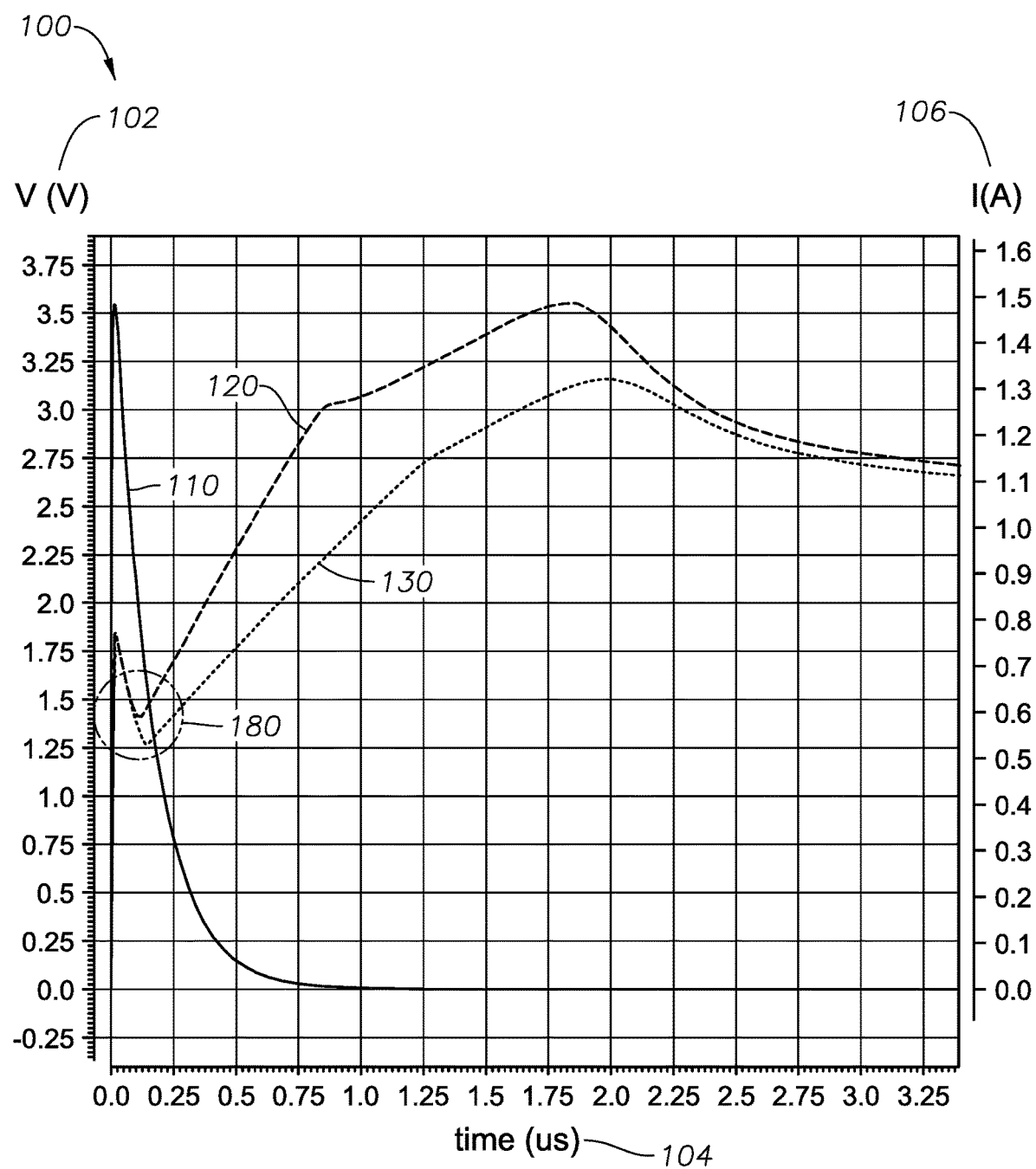
FIG. 1 is a graph illustrating an example voltage waveform simulation.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration and many of the units are normalized to showcase relative trends. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. While certain diagrams as illustrated herein are shown in two-dimensions, aspects of the diagrams as provided herein are to be understood to be three-dimensional having X, Y and Z axes. Therefore, the following detailed description is not to be taken to limit claimed subject matter and/or equivalents.

DETAILED DESCRIPTION

According to one implementation of the present disclosure, an apparatus includes: detection circuitry, inverter circuitry, a clamping device, and first control circuitry that is coupled to the detection circuitry, inverter circuitry and the clamping device. In response to a detection signal from the detection circuitry, the control circuitry is configured to generate a first control signal to regulate a current (e.g., an inrush current) to be below a leakage current threshold.

According to another implementation of the present disclosure, an apparatus includes: detection circuitry, a clamping device, inverter circuitry, and first and second control circuitry. In response to a first voltage corresponding to a gate terminal of the clamping device, the first control circuitry is configured to generate a second voltage to set the first voltage below a first voltage threshold. Also, in response to the second voltage, the second control circuitry is configured to generate a third voltage to set a voltage of the detection circuitry below a second voltage threshold.

According to another implementation of the present disclosure, an apparatus includes: detection circuitry, a clamping device, inverter circuitry, and first control circuitry. In response to a detection signal from the detection circuitry, a first control signal generated from the control circuitry is configured to provide a zero voltage to a gate terminal of the clamping device based on whether a power-up condition has occurred (e.g., RC time constant greater than 10 µs).

Advantageously, inventive aspects provide for an optimized and improved general purpose input-output (GPIO) ESD clamping circuit as well as an optimized and improved overdrive input-output (ODIO) ESD clamping circuit. In various implementations, the inventive GPIO and ODIO clamp circuits allow for the trade-off between ESD events and power-up sequence. Hence, the inventive circuit implementations as described herein provide improvements in ESD clamping efficiency and power-up inrush current immunity.

Figure 2:
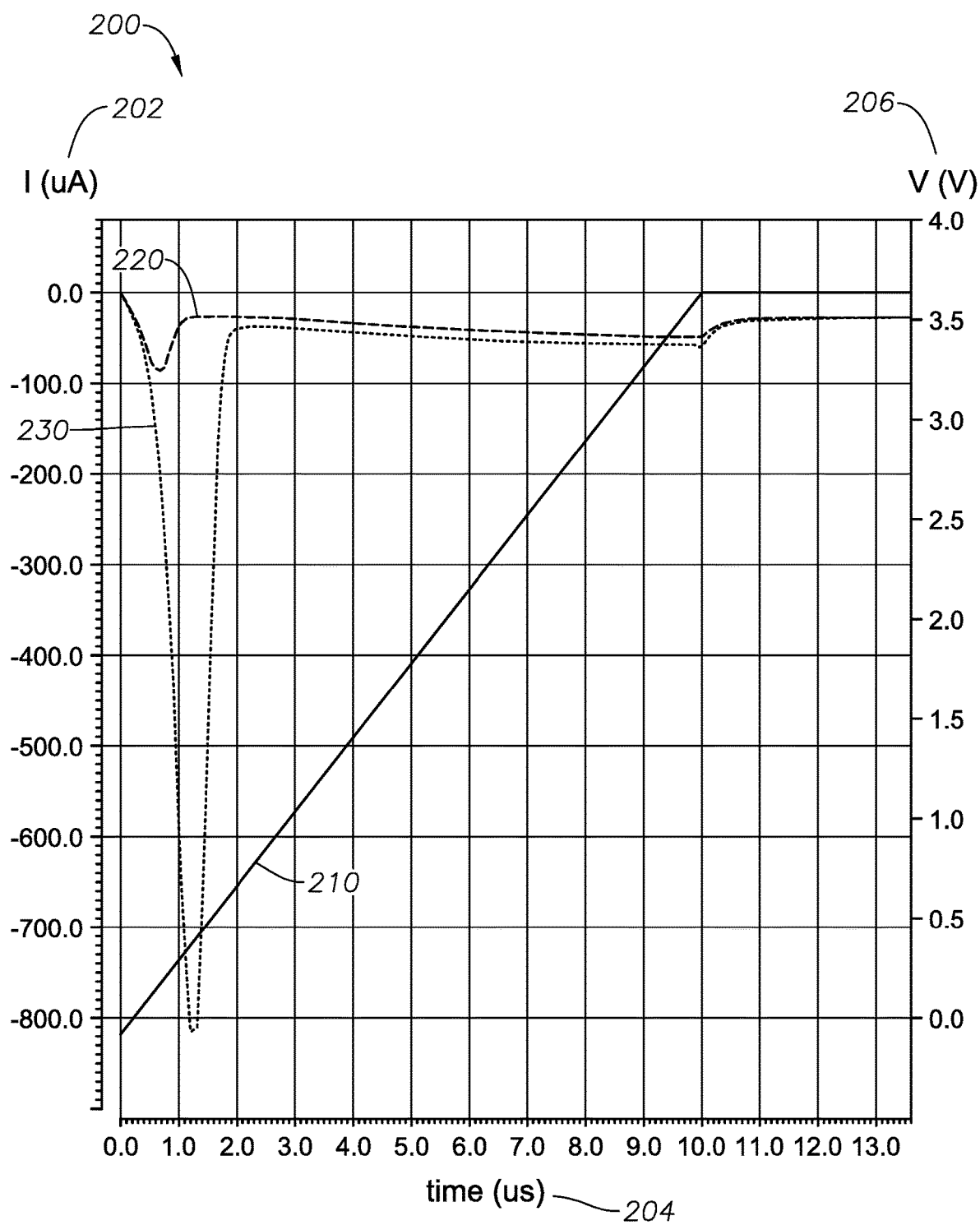
FIG. 2 is a graph illustrating an example current waveform simulation.

Referring to FIGS. 1-2, graphs 100, 200 are shown. The graph 100 illustrates an example ESD waveform simulation of FIG. 1. As an example, the graph 100 illustrates voltage (V) on the y-axis as a function of time (µs) on the x-axis. For instance, when an ESD event (i.e., transient voltage) appears on a power rail, the voltage may go up to 3.75V (event though the ESD event itself may be induced by a capacitor charged under a few thousand volts), as the clamping circuit "turns on" concurrently. As shown, FIGS. 1-2 depict the "trade off" between a human body model (HBM) ESD event clamping efficiency and a minimized inrush current during a power ramp (e.g., a power "up") for a GPIO clamp circuit. FIG. 1 depicts an example graph of the influence of an HBM ESD event (110) (e.g., a current waveform in ampere to be read on a separate second Y-axis (Y2) 106 in FIG. 1), while FIG. 2 depicts a corresponding graph of the influence of the power-up (210) (i.e., a voltage signal read on a separate second Y-axis (Y2) 206 in FIG. 2) on the inrush current (220 & 230) on a classical single inverter stage RC triggered power supply clamp.

In FIG. 1, for an example inverter transistor device (N14) (i.e., the NMOS device of the inverter circuitry) in a conventional GPIO clamp circuit, voltage (in volts) 102 (from −0.25V to 3.75V) is plotted across a time range 104 (from 0.0 µs to 3.25 µs) for two sizes of transistor device N14 (i.e., 14 µm (120), and 1 µm (130). Hence, as illustrated, FIG. 1 depicts a first curve 110 representing the ESD HBM current pulse event, a second curve 120 plotting voltage/time of the gate node (NGATE) of transistor N0 with an example size of 14 µm for device N14, and a third curve 130 plotting voltage of the gate node (NGATE) of transistor N0 with an example size of 1 µm for device N14.

Similarly, in FIG. 2, for the example inverter transistor device (N14) (i.e., the NMOS device of the inverter circuitry) in an conventional GPIO clamp circuit, the power supply (DVDD) current (µA) 202 (from −800 µA to 0 µA) is plotted across a time range 204 from 0.0 to 13 µs for the two sizes (i.e., 14 µm (120), and 1 µm (130). Hence, as illustrated, FIG. 2 depicts a first curve 210 representing a power-up sequence of supply (DVDD), a second curve 220 plotting the induced inrush current with an example size of 14 µm for device N14, and a third curve 230 plotting the induced inrush current with an example size of 1 µm for device N14.

Of note, with reference to FIG. 1, as the lifetime of the ESD event (shown as the curve 110) is relatively fast, it would be desirable to "trigger" an ESD protection during the full duration of the stress. Hence, under the "stress" of the ESD event (the first curve 110), it would be desirable to have the second and third curves, 120, 130 to be as low as possible during the full ESD stress time window. Nevertheless, concurrently, with reference to FIG. 2, a transient behavior due to power-up/power ramp would also be detected. An example, a power ramp is shown as the first curve 210 of FIG. 2 having a "rise-time" of 10 µs. Accordingly, to optimize for the "trade-off", an improved circuit would have to account for a "fast" rise time (e.g., 0-0.5 µs; such as an ESD event) and provide for the clamp circuit to be fully "open", but also, for a "slow" rise time (e.g., 10 µs; such as a power-up event/sequence), the clamp circuit should be "off" so that it would not be "triggered" by a power up event/sequence.

As may be appreciated, with reference to both FIGS. 1 and 2, while the third curve 130 device (having a N14 device size 1 µm) in FIG. 1 illustrates an improvement to optimize for ESD in comparison to the second curve 120 (having a N14 device size 14 µm) (which has a higher voltage detected), the corresponding third curve 230 in FIG. 2 illustrates significant inrush current during a fast power-up sequence (e.g., to approximately 800 µA) in comparison to the second curve 220 (where the inrush current is significantly less).

Hence, in comparison of the two sizes, 1 µm and 14 µm, inrush current can be accounted for, but at the cost expenses of extra voltage under ESD stress. One other consideration (or constraint) to be considered as well would be the maximum area of the N14 device that can be used for such a clamp circuit. Accordingly, by "adjusting" the size of the N14 device, HBM clamping efficiency and inrush current can be controlled, but such a control would be largely ineffective and difficult to perform. For instance, by utilizing one single device to achieve a certain savings on one side (e.g., clamping efficiency), a detrimental effect would occur on the other side (e.g., inrush current).

Advantageously, the proposed optimized clamp circuits as described herein enhance the trade-off capability. By utilizing two separate circuitries, the two considerations: the same/or better clamping efficiency (i.e., less voltage impact) as well reduction in inrush current (i.e., less inrush current as a result of power-up sequences) can be optimized efficiently without causing an adverse impact to the other.

Also, with reference to FIG. 1, approximately at the reference numeral 180 (voltage/time (V/T) operating point), clamping efficiency is shown. For instance, at this "level" of ESD current, voltage of an example clamp circuit may be maintained at a "low" level. As observed, the third curve 130 is at a voltage level below the second curve 120. In contrast, in FIG. 2, for inrush current, it is observed that by reducing the size of the N14 device, the current observed went from approximately 86 µA to approximately 817 µA; a 10× increase that is not desirable.

Accordingly, inventive optimized clamp circuits (e.g., as described with reference to FIGS. 5-9) can provide independent controls to separately control the clamping efficiency (e.g., in the ESD range of approximately 0 µs to 0.5) as well as the inrush current during power ramp applications (e.g., approximately 10 μs or greater). Inventive aspects as disclosed herein with reference to FIGS. 5 and 9 provide for such a capacity.

Figure 3:
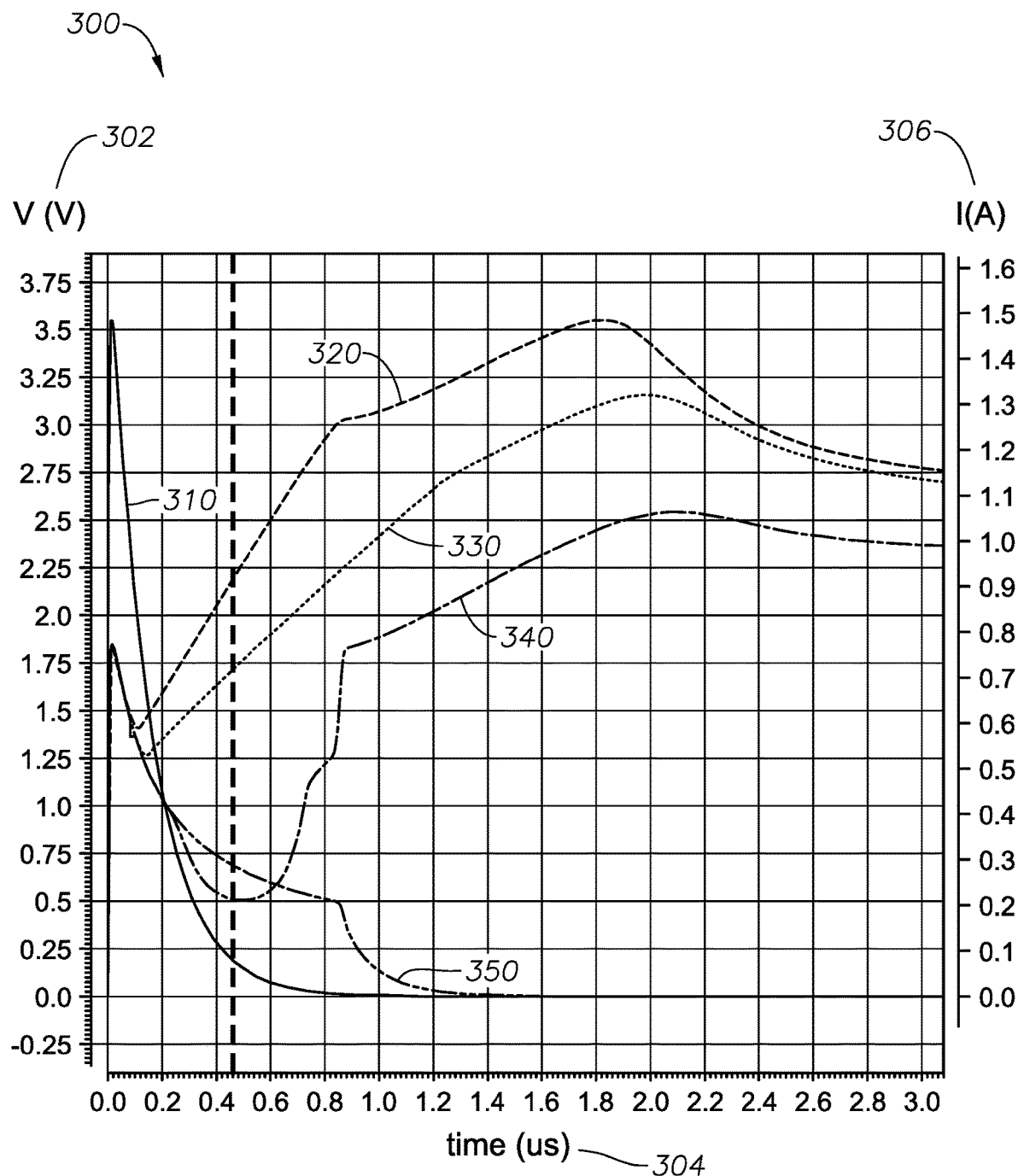
FIG. 3 is a graph illustrating an example voltage waveform simulation.
Figure 4:
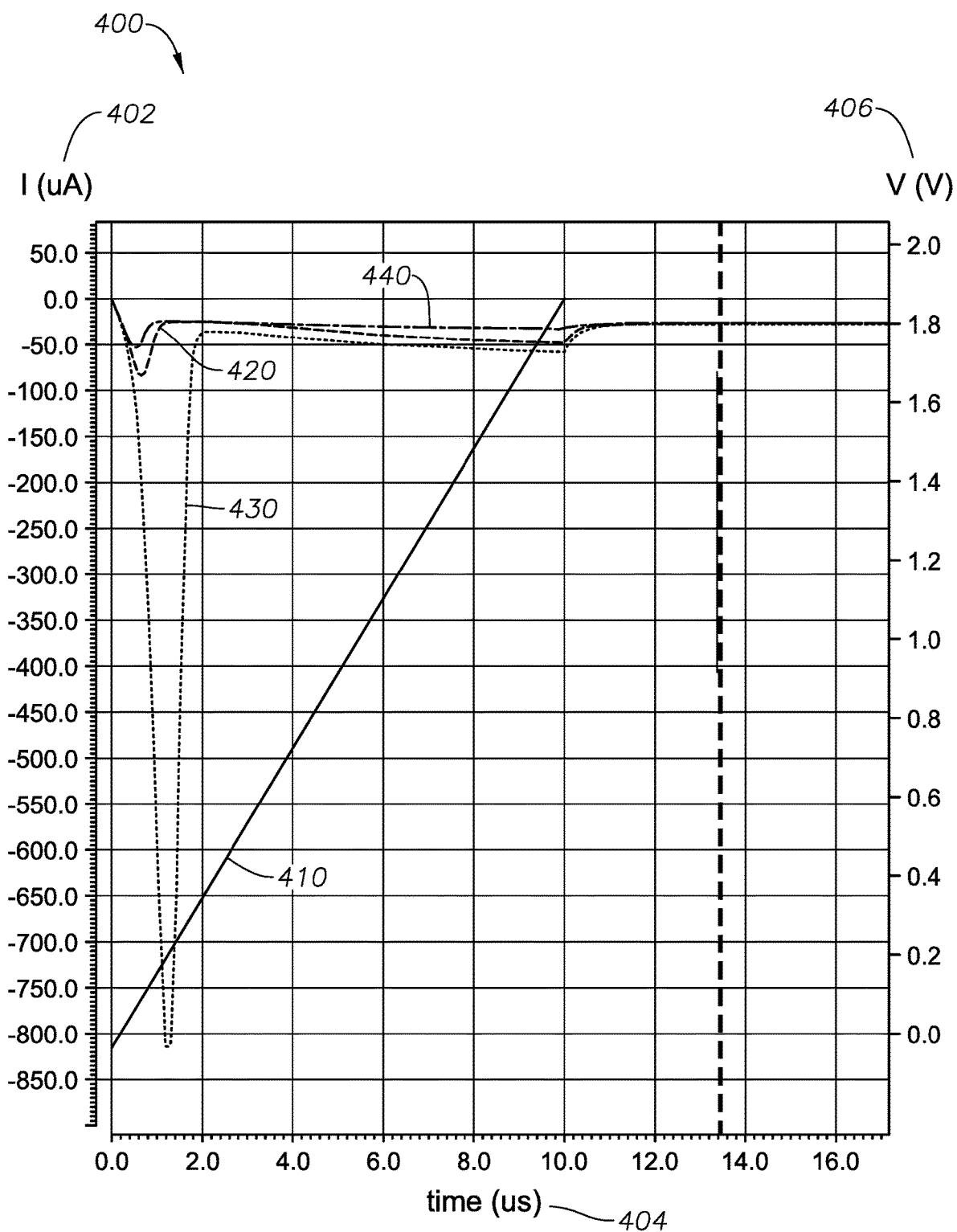
FIG. 4 is a graph illustrating an example current waveform simulation.

Referring to FIGS. 3 and 4, graphs 300, 400 according to example implementations are shown. As shown, FIGS. 3 and 4 depict the same graphs 100, 200 in FIGS. 1 and 2 including respective curves 310, 320, and 330 (corresponding to curves 110, 120, and 130 in FIG. 1) and respective curves 410, 420, and 430 (corresponding to curves 210, 220, and 230 in FIG. 2), but with a fourth curve 340, 440 corresponding to voltage/time and current/time of an example N14 device (i.e., with an area of 1 μm) in the example inventive circuit 500 (as described with FIG. 5). As illustrated, in FIG. 3, the fourth curve 340 is observed to maintain the clamping efficiency (i.e., a lower voltage for a greater time frame (e.g., approximately 0.1 to 0.6), while the fourth curve 440 in FIG. 4, is shown to have an inrush current of 54 μA (which is significantly lower than the designs of 86 μA and 817 μA as shown in the first and second curves 220, 230). Also included in FIG. 3 is a fifth curve 350 corresponding to the NGATE voltage of the example inventive circuit 500. As may be appreciated, the NGATE voltage is fully controlled after an ESD event.

Figure 5:
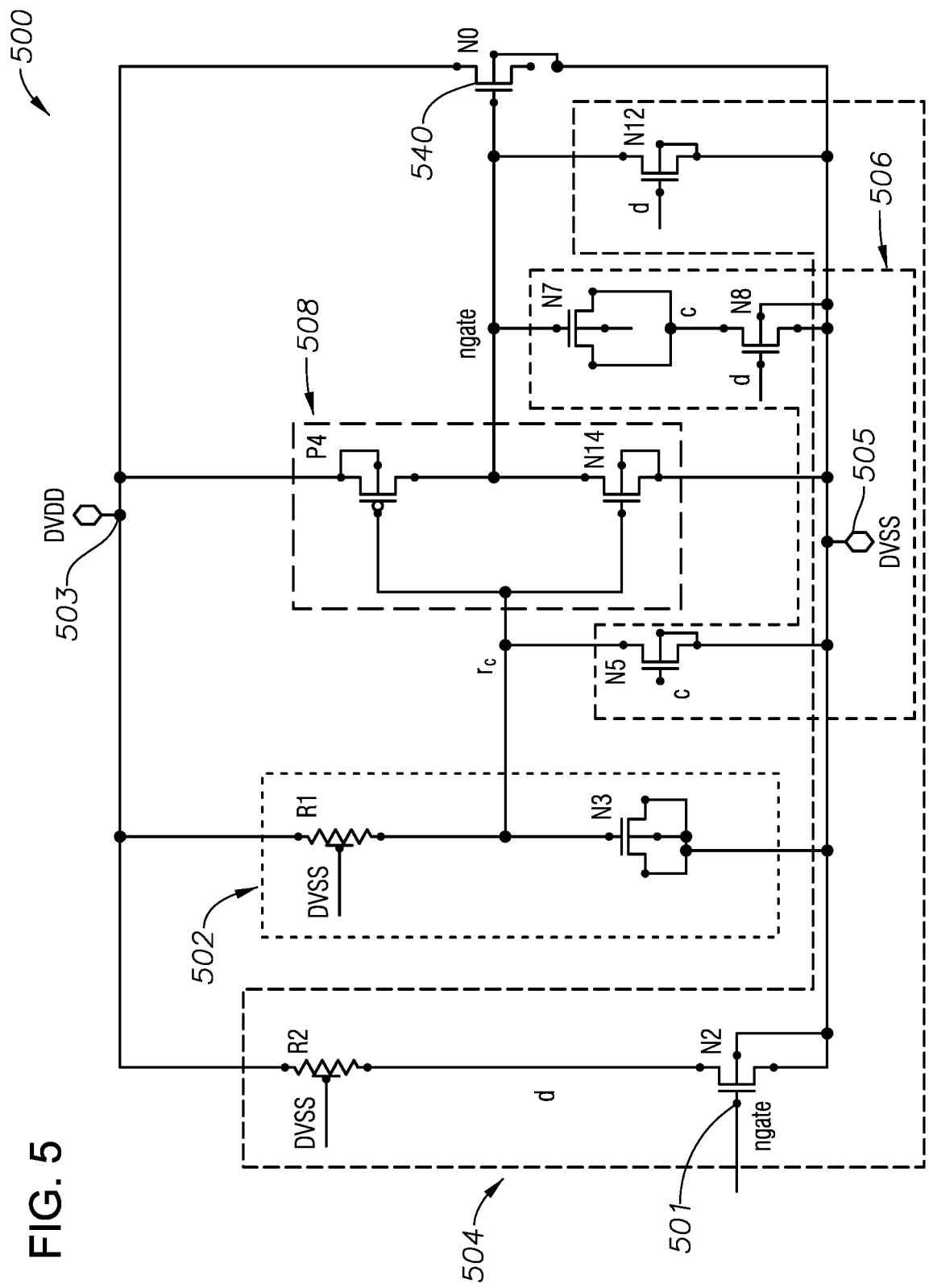
FIG. 5 is a circuit diagram of a system that is operable to control an example clamping device.

Referring to FIG. 5, a system 500 (i.e., an integrated circuit, a GPIO power supply ESD clamp circuit) to detect and limit voltage increase under ESD with a control circuitry for improved trade-off between (HBM) clamping efficiency and inrush current is shown. In certain implementations, the system 500 includes detection circuitry 502 (i.e., a detection stage, a resistor-capacitor (RC) "trigger" portion), first control circuitry 504 (i.e., inrush current control circuitry), second control circuitry 506 (i.e., boost circuitry), inverter circuitry 508 (i.e., intermediate-driver circuitry), and a clamping device 540 (i.e., a bigFET device). As illustrated, the first control circuitry 504 can be coupled to the detection circuitry 502 through inverter circuitry 508 (e.g., receiving a ngate signal 501) and coupled to the clamping device 540 (e.g., due to the signal "d" and N12 branch acting on the ngate 501).

As depicted in FIG. 5, the detection circuitry 502 may include a detection portion (RC trigger portion) having a resistor R1 and a capacitor N3 (e.g., a metal-oxide-semiconductor (MOS) capacitor) (i.e., an R-C structure). The detection circuitry 502 is coupled to reference nodes (or supply nodes (power and ground) in certain cases) 505 and 503 and is responsive to the transient voltage signal from the power supply rail DVDD. In alternative implementations, the detection portion 502 may include other circuit elements and/or circuit devices that are configured to generate the detection signal (rc).

The detection circuitry 502 may be configured to quickly detect a destructive transient voltage signal (e.g., an "ESD" pulse, a voltage transient, an external undesired electrical event) or a fast power-ramp sequence on a power supply rail (i.e., power rail, supply rail, voltage source) (DVDD) and transmit a detection signal (rc) (i.e., a transient-triggered detection signal, a delayed version of the transient voltage signal) to the clamping device 540 (i.e., N0) and the first control circuitry 504. Enabled by the detection signal, the first control circuitry 504 may be configured to control a gate terminal (i.e., ngate) of the clamping device 540 (i.e., N0).

The first control circuitry 504 (i.e., inrush-current control circuit) can include a first resistor (R2), a first n-type metal-oxide-semiconductor (NMOS) device (N2, a first transistor), and a second NMOS device (N12). In certain implementations, responsive to a detection signal ("rc") from the detection circuitry (502) through the inverter circuitry (508), the first control circuitry 504 generates the first control signal ("d"), which is configured to provide ("set") approximately a zero voltage to the N12 gate terminal ("d") and limit the inverter circuitry (508) "action" (i.e., impact) on to the gate terminal ("ngate") of the clamping device 540 (i.e., gate of the bigFET) based on whether a power ramp up has occurred and not an ESD event. Also, in response to the detection signal ("rc") from the detection circuitry 502, the first control circuitry 504 can be configured to generate the first control signal (i.e., "d") (to control a first voltage (i.e., ngate)) to regulate (control; "to limit") a current (e.g., inrush current) (to be) below a leakage current threshold (i.e., to limit inrush current within a leakage current threshold level; thus, preventing impact during a non-ESD event, such as a fast power-up). In various implementations, the current threshold level may correspond to the current leakage-level of the clamping device 540 (i.e., N0, the big-FET device).

The inverter circuitry 508 (i.e., pre-driver circuit, inverter stage (e.g., single stage")) includes an adaptation stage coupled in between the detection circuitry 502 and the clamping device 540. In certain implementations, the inverter circuitry 508 includes an NMOS device (N14) and a P-channel metal-oxide-semiconductor (PMOS) device (P4) (e.g., a significantly "larger" device in comparison to the N14 device).

In certain implementations, the clamping device 540 may include any circuit device having at least three terminals (e.g., power, ground, and control). In some implementations, the clamping device 540 may be one or more field-effect transistors (FET). For example, the clamping device 540 may be a n-channel FET or a big-FET. In example embodiments, the clamping device 540 may be configured to shunt ESD current between supply rails, DVDD and DVSS, and to at least partially quench transient voltage (i.e., remove electrostatic charge) in the system 500.

The second control circuitry 506 (i.e., an ESD detection "boost" circuit) may include an NMOS device (N5), a capacitor (N7, a relatively "small" capacitor (e.g., a MOS capacitor)), and a first switch (N8, control switch). In operation, the second control circuitry 506 can be configured to control a voltage of the detection circuitry (i.e., to control the charging of the detection circuitry 502) such that the PMOS device (P4) of the inverter circuitry 508 can be configured to generate a "stronger" drive signal (i.e., a greater voltage) to control a gate terminal of the clamping device 540 (i.e., gate terminal of the bigFET device).

In combination, as a dual feedback circuit, the first and second control circuitries 504, 506 operate in concert. For instance, in certain implementations for dual feedback, in response to a first voltage corresponding to a gate terminal of the clamping device (i.e., ngate) (based on a detection signal of the detection circuitry 502), the first control circuitry 504 can be configured to generate a second voltage ("d", the first control signal) to set the first voltage below a first voltage threshold (e.g., the first voltage threshold corresponds to approximately "0" volts during a power-ramp event), and would "follow" (i.e., approximately equal to) DVDD during an ESD event). Also, in response to the second voltage ("d", the first control signal), for an ESD event, the second control circuitry 506 may be configured to generate a third voltage ("c") to set a voltage of the detection circuitry 502 ("rc") below a second voltage threshold (i.e., a maximum allowable "rc" voltage) (e.g., the "rc" would be desired to be as low as possible under the ESD event (e.g., approximately 0 volts), as the voltage of the detection circuitry 502 would already be maintained at least below an input threshold voltage level of the inverter circuit 508 during such an ESD event or at least below one-half of the DVDD voltage signal level. Accordingly, the second threshold voltage would be maintained "high" and/or approximately at the DVDD voltage.) Also, under ESD, the "third voltage (c)" would be maintained "high", and would "follow" (correspond to) ngate for at least an initial time. During a power ramp event, the "c" voltage would be set to 0, and thus would not have any impact on the detection circuitry voltage "rc".

With reference to FIG. 5, the first control circuitry 504 (i.e., the inrush control circuit) utilizes the resistor R2, NMOS transistors N2 and N12 in a feedback loop such that it would generate the control signal "d". In turn, the control signal "d" is configured to "keep-off" the BigFET during a power ramp event by controlling "ngate" voltage to limit the inrush-current within a leakage current level. Hence, no impact would be observed during an ESD event.

Similarly, as illustrated, the second control circuit 506 (i.e., the ESD detection boost circuit) may include NMOS transistors N7 (formed as a MOS capacitor), N5 and N8 (e.g., a switch) in a feedback loop to generate a signal "c". In turn, the signal "c" is configured to control net "rc" during an ESD HBM event to maintain "ngate" "higher" for a longer time frame. For example, initially, the signal "c" is configured to control "rc" "lower" for a longer time frame, and thus maintain "ngate" "higher" through the inverter stage 508. In doing so, increased clamping efficiency is realized for the clamping device 540 (e.g., BigFET) with no adverse impact during a power ramp event.

Specifically, in one example operation, during a power-ramp, the node "d" from the first control circuit 504 would "follow" (i.e., corresponds to, approximately equal to) the supply voltage (DVDD), and the N12 device would "make" the "ngate" at around a zero level (i.e., the voltage at the drain terminal of the N12 is approximately zero). Hence, no inrush current would be observed. Moreover, the signal "c" from the second control circuit would be "kept" at a zero level by the N8 device, so the N5 device would remain "off". Accordingly, no false ESD boost would occur, and so, no adverse impact is observed from the power ramp-up sequence as well.

Similarly, during an ESD HBM event, the "ngate" voltage would rise to higher voltage through a coupling of the drain node of clamping device 540 (e.g., BigFET (N0)) and is also actively charged through the pre-driver stage PMOS (P4) of the pre-driver circuit 508. The P4 device would turn on the N2 device from the first control circuit 504 (i.e., inrush current control circuit) and "make" node "d" zero. In turn, by doing so, the N12 device would turn "off"; and thus, no adverse impact would be observed on the clamping device during the ESD event. Also, the node "c" will be coupled to "ngate" through the capacitor N7 and, thus, would turn "on" the N5 device. In doing so, the effective "rc" time constant would be greater (keeping the "rc" and "ngate" longer at a low voltage (e.g., approximately 0V) and through the pre-driver stage (508)), and would "keep" the "ngate" at a higher voltage level than the clamping device 540 voltage threshold (Vth) for more time; and thus, the voltage across the clamping device 540 would be observed to be lower.

In one example design, at the "d" node, generally, the ESD event would be faster on DVDD. Hence, with the ngate coupled to the N0 drain, DVDD can be driven to the gate of N0, and would be coupled to parasitic capacitance itself. Also, the pre-driver circuit 508 would make the node NGATE "following" (i.e., approximately equal to; corresponding to) DVDD. The inverter stage 508 can be designed such that the P4 PMOS device is quite large (120 micrometers) and the N14 NMOS device would be weaker in comparison (1 micrometers). For example, the PMOS device would be 120 times larger. In operation, the RC circuit 502 would take approximately 1 μs of time, and during that time, the entire ESD current should be discharged from the clamping device 540. Hence, the RC circuit 502 would not charge "enough" to allow the N14 device to "strongly" (i.e., with ease) turn "on" and correspondingly "bring" NGATE below a threshold voltage (Vth) of the clamping device 540 (N0); and thus, would not fully discharge the current of the clamping device 540. During ESD events, the NGATE would be coupled to the DVDD and hence would be faster; whereas during power ramp events, from approximately the 10 μs range or slower where ngate may not "be coupled enough" to the DVDD.

Advantageously, as described herein, the first control circuit 504 is configured to control ngate and to switch it "off", when there is not an ESD event and when the ESD clamp circuit 500 goes into a power up sequence. Moreover, the second control circuit 506 can increase performance of the circuit 500 by boost triggering of the clamping device 540 in order to minimize the voltage build-up during an ESD event.

Advantageously, the ESD clamp circuit 500 employs multiple feedback loops (e.g., ngate, d, and c signals) to obtain better control of the clamping device 540 instead of having direct driving scheme. Moreover, the dual control mode of the circuit 500 provides two effects and acts on the two drawbacks in trade-off. For instance, when ESD protection is boosted, false triggering immunity and inrush current can be degraded. Advantageously, according to inventive aspects, despite ESD protection is boosted, inrush current can be better controlled under power-up condition with the switch-off control circuit (504) acting on the ngate.

Figure 6:
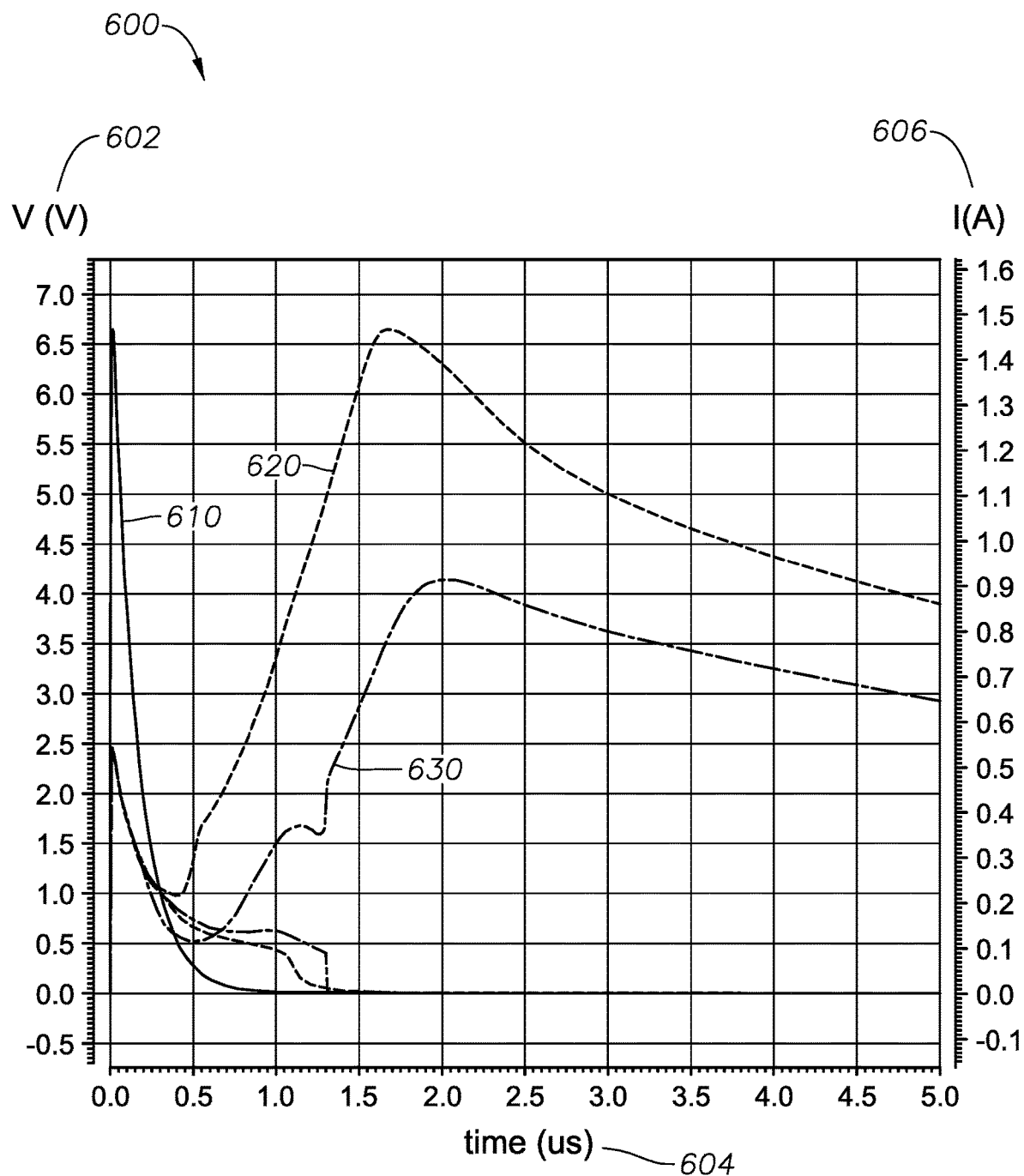
FIG. 6 is a graph illustrating an example voltage waveform simulation.
Figure 7:
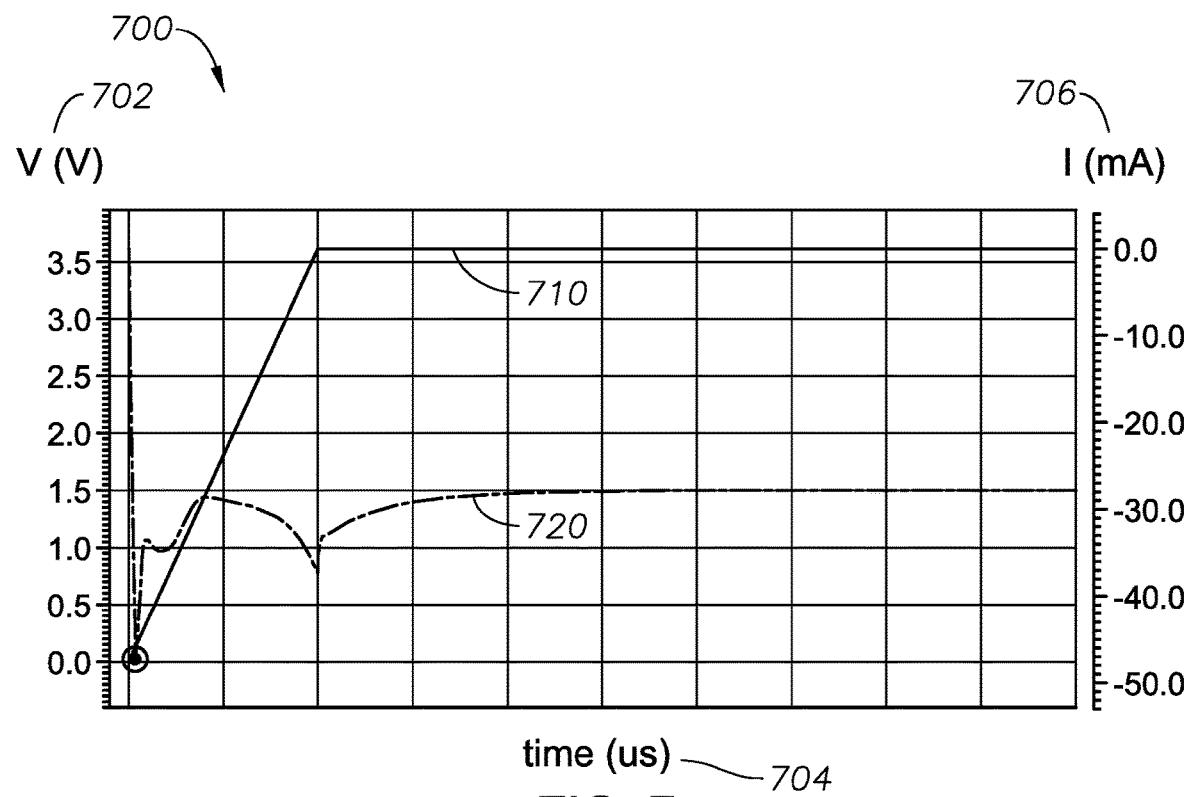
FIG. 7 is a graph illustrating an example voltage waveform simulation.
Figure 8:
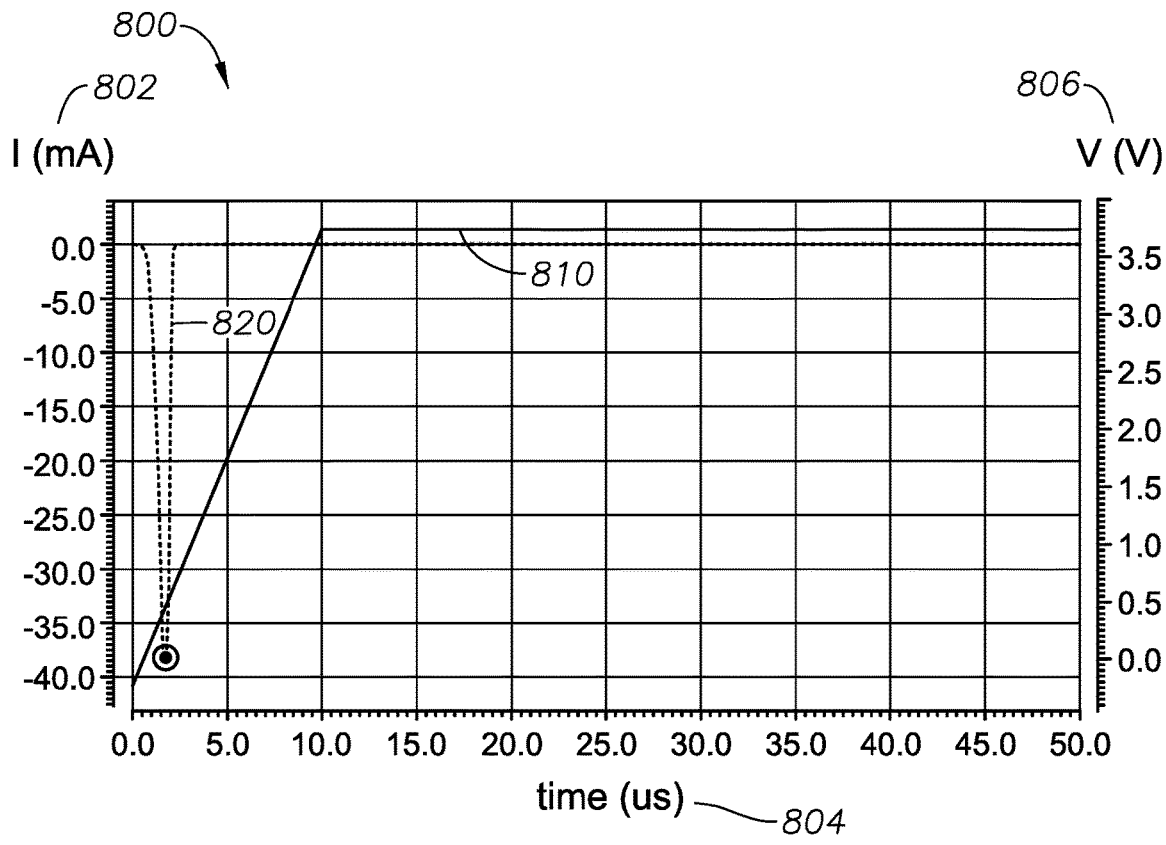
FIG. 8 is a graph illustrating an example current waveform simulation.
Figure 9:
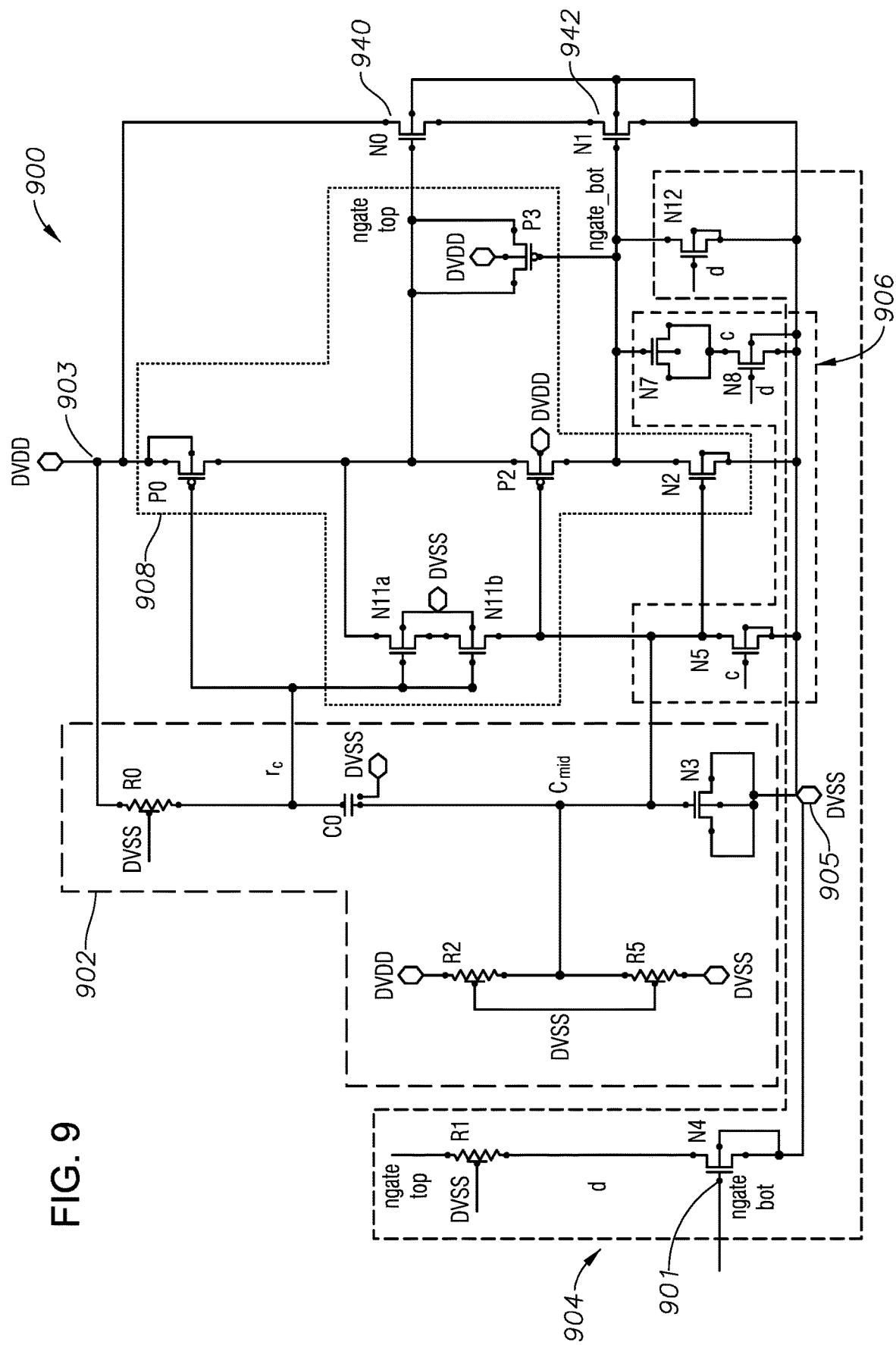
FIG. 9 is a circuit diagram of a system that is operable to control example clamping devices.

Referring to FIGS. 6-8, graphs 600, 700, 800 are corresponding to example implementation shown in FIG. 9. FIGS. 6-8 illustrate depict the "trade off" between a human body model (HBM) ESD event and an inrush current event during a power ramp (e.g., a power "up") for an inventive ODIO clamp circuit (e.g., described with reference to FIG. 9). FIG. 6 depicts an example curve of the influence of an HBM ESD event (as shown by the current waveform curve 610 in ampere to be read on the second Y-axis (Y2) 606 (on the right), the results of an example conventional ODIO clamp circuit (as shown by the curve 620 as read in voltage on the first Y-axis (Y1) 602 (on the left)), and the results of the inventive ODIO clamp circuit (as shown by the curve 630 as read in voltage on the first Y-axis (Y1) 602). FIG. 7 depicts an example curve of the power ramp event 710 and the results (e.g., as read on the Y1 axis 702 (on the left) illustrating voltage from 0 to above 3.5V) of the inventive ODIO clamp circuit (as shown by the leakage current curve 720 (e.g., as read on the Y2 axis 706 (on the right) illustrating current from −50 to 0 mA). FIG. 8 depicts an example curve of power ramp event 810 (e.g., as read on the Y2 axis 806 (on the right) illustrating voltage from 0 to above 3.5 V) and the inrush current result of a conventional ODIO clamp circuit (as shown by the inrush current curve 820) (e.g., as read on the Y1 axis 802 (on the left) illustrating current from −50 to 0 mA).

Referring to FIG. 9, a system 900 (i.e., an integrated circuit, an ODIO power supply ESD clamp circuit) to control a trade-off between (HBM) clamping efficiency and inrush current is shown. In certain implementations, the system 900 includes detection circuitry 902 (i.e., a detection stage, a resistor-capacitor (RC) "trigger" portion), first control circuitry 904 (i.e., inrush current control circuitry), second control circuitry 906 (i.e., boost circuitry), inverter circuitry 908 (i.e., intermediate-driver circuitry), and first and second clamping device 940, 942 (N0, N1) (e.g., stacked bigFET devices). As illustrated, the first control circuitry 904 and the second control circuitry 906 can be coupled to the detection circuitry 902, inverter circuitry 908 and the clamping devices 940, 942.

As depicted in FIG. 9, the detection circuitry 902 may include a detection portion (RC trigger portion) having resistors R0, R2, R5, a capacitor N3 (e.g., a metal-oxide-semiconductor (MOS) capacitor) (i.e., an R-C structure), and an additional capacitor C0. The detection circuitry 902 is coupled to reference nodes 903 (corresponding to DVDD) and 905 (corresponding to DVSS), and is responsive to the transient voltage signal from the power supply rail DVDD. In alternative implementations, the detection portion 902 may include other circuit elements and/or circuit devices that are configured to generate the detection signal (rc).

The detection circuitry 902 may be configured to quickly detect a destructive transient voltage signal (e.g., an ESD event, a voltage transient, an external undesired electrical event) or a fast power-ramp sequence on a power supply rail (i.e., power rail, supply rail, voltage source) (DVDD) and transmit the detection signal (rc) (i.e., a transient-triggered detection signal, a delayed version of the transient voltage signal, after the inverter circuitry 908) to the first control circuitry 904. Enabled by the detection signal, the first control circuitry 904 may be configured to control a gate terminal (i.e., ngate) of the clamping devices 940, 942 (i.e., N0, N1).

The first control circuitry 904 (i.e., inrush-current control circuit) can include a first resistor (R1), a first n-type metal-oxide-semiconductor (NMOS) device (N4, a first transistor), and a second NMOS device (N12). In certain implementations, responsive to a detection signal ("rc") from the detection circuitry 902 through the inverter 908 and ngate_bot, the first control circuitry 904 generates the first control signal ("d"), which is configured to provide ("set") approximately a zero voltage to the gate terminals ("ngates"_top and ngate_bot) of the clamping devices 940, 942 (i.e., gates of the bigFETs) based on whether a power ramp up as occurred (and not an ESD event). Also, in response to the detection signal ("rc") from the detection circuitry 902, the first control circuitry 904 can be configured to generate the first control signal (i.e., "d") (to control a first voltage (e.g., ngates; either ngate top or ngate_bot)) to regulate (control; "to limit") a current (i.e., inrush current) (to be) below a leakage current threshold (i.e., to limit inrush current within a leakage current threshold level; thus, preventing impact during power ramp up). In various implementations, the current threshold level may not exceed or be as close as possible to the DC current leakage-level of the clamping devices 940, 942 (i.e., N0, N1) (e.g., the big-FET devices). As may be appreciated, with regard to the generation of "d" signal generation (in such an overdrive circuit 900), due to stress on the devices, the "d" signal is not coupled to DVDD, but rather through ngate top and ngate_bot.

The inverter circuitry 908 (i.e., pre-driver circuit, inverter stage ("single stage")) includes an adaptation stage coupled in-between the detection circuitry 902 and the clamping devices 940, 942. In certain implementations, the inverter circuitry 908 includes an NMOS device (N2), stacked NMOS devices (i.e., stacked devices N11a and N11b), and three P-channel metal-oxide-semiconductor (PMOS) devices (P0, P2, P3).

In certain implementations, the clamping devices 940, 942 may include any circuit device having at least three terminals (e.g., two terminals to provide a path between power and ground and one trigger terminal). In some implementations, the clamping devices 940, 942 may be one or more field-effect transistors (FET). For example, the clamping devices 940, 942 may be a n-channel FET or a big-FET. In example embodiments, the clamping devices 940, 942 may be configured to shunt ESD current between supply rails, DVDD and DVSS, and to at least partially quench transient voltage (i.e., remove electrostatic charge) in the system 900.

The second control circuitry 906 (i.e., an ESD detection "boost" circuit) may include an NMOS device (N5), a capacitor (N7, a relatively "small" capacitor (e.g., a MOS capacitor)), and a first switch (N8, control switch). In operation, the second control circuitry 906 can be configured to control a voltage (Cmid) of the detection circuitry (i.e., to control the charging of the detection circuitry 902) such that the NMOS device (N2) of the inverter will remain OFF and PMOS devices (P0, P2) of the inverter circuitry 908 can be configured to generate a drive signal to control gate terminals of the clamping devices 940, 942 (i.e., gate terminals of the bigFET devices).

With reference to FIG. 9, the first control circuit 904 (i.e., the inrush current control circuit) includes the resistor R1 and NMOS transistors N4 and N12 in a feedback loop such that it generates a control signal "d". The control signal "d" is configured to "keep" the clamping devices 940, 942 (e.g., BigFET devices) "off" during a power ramp event by controlling "ngates" voltage, so that inrush-current may be limited to be within a leakage current level threshold. By doing so, there would be no impact during a power ramp event. Also, the control signal "d" is configured to keep N12 "off" during an ESD event so as not disturb other circuitry functionality Similarly, the second control circuit 906 (ESD detection boost circuit) includes NMOS transistors N7 (formed as MOS capacitor), N5 and N8 (e.g., a control switch) in a feedback loop such that it generates a signal "c". In turn, the signal "c" is configured "high" to control nets "Cmid and rc" during an ESD HBM event to maintain "ngates" higher for a greater time period to boost the clamping efficiency of the clamping devices 940, 942, and "c" is configured "low" under power-up to prevent any disturbance on the "Cmid and rc" nets, and have no adverse impact during a power ramp event.

Specifically, in one example operation, during a power ramp event, the node "d" from the inrush current control circuit 504 "follows" "ngate_top" and the N12 device is configured to set (i.e., make) the "ngate_bot (ngate bottom)" at an approximately zero voltage level. Hence, no inrush current. Correspondingly, the node "c" would be "kept" at a zero voltage level by the transistor N8 device, while N5 device would remain "off". Hence, there would be no impact to the power ramp inrush-current.

Moreover, for an ESD HBM event, the "ngate_top" voltage would rise to a higher voltage (e.g., significantly greater than the threshold voltage (Vth) of the BigFET N0) through the coupling of a drain node of the BigFET (N0) also charged through the pre-driver stage PMOS (P0). In turn, the coupling to "ngate_bot" is activated through the MOS capacitor P3 and increases the "ngate_bot" voltage. Correspondingly, the N4 device would turn "on" and make "d" signal set to zero, therefore the N12 device would turn "off". Hence, there would be no impact of the inrush current control circuitry (904) on the circuit 900 ESD behavior.

Moreover, the node "c" would be coupled to "ngate_bot" through capacitor N6, which would turn "on" the N5 device. In doing so, this will increase the effective "rc" time constant, and the "ngate_bot" would remain at a "higher" voltage level (e.g., more than the threshold voltage "Vth" of the second clamping device 942 "BigFET N1") for a greater time. Thus, the clamping devices 940, 942 voltage would be "lower" (e.g., below an ESD failure limit of a non-ESD intended circuit device exposed in parallel under the same power net (here DVDD).

Although one or more of FIGS. 1-9 may illustrate systems, apparatuses, or circuits according to the teachings of the disclosure, the disclosure is not limited to these illustrated systems, apparatuses, or circuits. One or more functions or components of any of FIGS. 1-9 as illustrated or described herein may be combined with one or more other portions of another of FIGS. 1-9. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of any corresponding method or algorithm described implicitly in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An integrated circuit comprising:
   detection circuitry;
   inverter circuitry;
   a clamping device; and
   first control circuitry coupled to the detection circuitry, inverter circuitry and the clamping device, wherein in response to a detection signal from the detection circuitry, the first control circuitry is configured to generate a first control signal to regulate a current to be below a leakage current threshold,
   wherein the first control circuitry comprises a first resistor, a first NMOS device, and a second NMOS device.

2. The integrated circuit of claim 1, wherein the first control signal is configured to provide approximately zero voltage to a gate terminal of the clamping device.

3. The integrated circuit of claim 1, wherein the clamping device comprises a big-FET device.

4. The integrated circuit of claim 3, wherein the first control signal is configured to control a gate terminal of the big-FET device.

5. The integrated circuit of claim 1, wherein the inverter circuitry comprises at least a NMOS device and a PMOS device.

6. The integrated circuit of claim 1, wherein the detection circuitry is configured to detect a transient voltage and transmit the detection signal to the first control circuitry, and wherein the detection circuitry comprises a detection portion having a resistor and a capacitor.

7. The integrated circuit of claim 1, wherein the first control circuitry is configured to activate the clamping device to at least partially quench a transient voltage.

8. The integrated circuit of claim 1, further comprising:
   second control circuitry, comprising:
   a first NMOS device,
   a first capacitor, and
   a first switch, wherein responsive to at least the first control circuitry, the second control circuitry is configured to control a voltage of the detection circuitry such that a PMOS device of the inverter circuitry is configured to generate a drive signal to control a gate terminal of the clamping device.

9. The integrated circuit of claim 1, wherein
   the detection circuitry comprises a resistor and a capacitor; and
   the inverter circuitry comprises a PMOS device and a NMOS device.

10. An integrated circuit comprising:
    detection circuitry;
    a clamping device;
    inverter circuitry; and
    first and second control circuitry, wherein in response to a first voltage corresponding to a gate terminal of the clamping device, the first control circuitry is configured to generate a second voltage to set the first voltage below a first voltage threshold, and
    wherein in response to the second voltage, the second control circuitry is configured to generate a third voltage to set a voltage of the detection circuitry below a second voltage threshold.

11. The integrated circuit of claim 10, wherein in response to a detection signal detected in the detection circuitry, the inverter circuitry is configured to generate the first voltage.

12. The integrated circuit of claim 10, wherein the first voltage corresponds to an operating voltage during an ESD event and is approximately zero volts during a power ramp event.

13. The integrated circuit of claim 10, wherein the second voltage threshold corresponds to an operating voltage during a power ramp event and is a voltage close to zero during an ESD event.

14. The integrated circuit of claim 10, wherein the first control circuitry comprises:
   a first resistor,
   a first NMOS device, and
   a second NMOS device.

15. The integrated circuit of claim 10, wherein the clamping device comprises a big-FET device.

16. The integrated circuit of claim 10, wherein the inverter circuitry comprises at least an a NMOS device and a PMOS device.

17. The integrated circuit of claim 10, wherein the detection circuitry is configured to detect a transient voltage and transmit a detection signal to the first control circuitry, and wherein the detection circuitry comprises a detection portion having at least a resistor and a capacitor.

18. The integrated circuit of claim 10, wherein the second control circuitry comprises:
   a first NMOS device,
   a first capacitor, and
   a first switch, wherein responsive to at least the first control circuitry, the second control circuitry is configured to control a voltage of the detection circuitry such that a PMOS device of the inverter circuitry is configured to generate a drive signal to control a gate terminal of the clamping device.

19. An integrated circuit comprising:
   detection circuitry;
   a clamping device;
   inverter circuitry;
   first control circuitry, wherein in response to a detection signal from the detection circuitry, a first control signal generated from the first control circuitry is configured to provide a zero voltage to a gate terminal of the clamping device based on whether a power-up sequence has occurred; and
   second control circuitry, comprising: a first NMOS device, a first capacitor, and a first switch,
   wherein responsive to at least the first control circuitry, the second control circuitry is configured to control a voltage of the detection circuitry such that a PMOS device of the inverter circuitry is configured to generate a drive signal to control a gate terminal of the clamping device.

* * * * *